United States Patent
Egbe et al.

(10) Patent No.: US 7,700,533 B2
(45) Date of Patent: Apr. 20, 2010

(54) COMPOSITION FOR REMOVAL OF RESIDUE COMPRISING CATIONIC SALTS AND METHODS USING SAME

(75) Inventors: Matthew I. Egbe, West Norriton, PA (US); Michael Walter Legenza, Bellingham, MA (US)

(73) Assignee: Air Products and Chemicals, Inc., Allentown, PA (US)

( * ) Notice: Subject to any disclaimer, the term of this patent is extended or adjusted under 35 U.S.C. 154(b) by 969 days.

(21) Appl. No.: 11/452,290

(22) Filed: Jun. 14, 2006

(65) Prior Publication Data

US 2006/0293208 A1 Dec. 28, 2006

Related U.S. Application Data

(60) Provisional application No. 60/693,205, filed on Jun. 23, 2005.

(51) Int. Cl.
*C11D 7/50* (2006.01)
(52) U.S. Cl. ........................... 510/175; 510/176
(58) Field of Classification Search ................ 510/175, 510/176
See application file for complete search history.

(56) References Cited

U.S. PATENT DOCUMENTS

| 3,673,099 | A | | 6/1972 | Corby et al. | |
|---|---|---|---|---|---|
| 4,268,406 | A | * | 5/1981 | O'Brien et al. | 510/237 |
| 4,876,223 | A | * | 10/1989 | Yoda et al. | 438/643 |
| 5,468,423 | A | | 11/1995 | Garabedian, Jr. et al. | |
| 5,741,432 | A | | 4/1998 | Wong | |
| 6,270,694 | B1 | * | 8/2001 | Blount | 252/607 |
| 6,991,888 | B2 | | 1/2006 | Padmanaban et al. | |
| 7,030,201 | B2 | | 4/2006 | Yao et al. | |
| 2003/0181345 | A1 | | 9/2003 | Bian | |
| 2004/0048761 | A1 | * | 3/2004 | Ikemoto | 510/175 |
| 2006/0003910 | A1 | * | 1/2006 | Hsu et al. | 510/176 |
| 2006/0014656 | A1 | * | 1/2006 | Egbe et al. | 510/175 |
| 2006/0172905 | A1 | * | 8/2006 | Rovito et al. | 510/175 |

FOREIGN PATENT DOCUMENTS

| EP | 0 678 571 B1 | 10/1995 |
|---|---|---|
| EP | 1 562 225 A1 | 8/2005 |
| JP | 2004031443 A | 1/2004 |
| RU | 1807077 A1 | 4/1993 |
| WO | 03/083920 A1 | 10/2003 |
| WO | WO 03/083920 A1 | 10/2003 |
| WO | WO 2005/001016 | 1/2005 |

\* cited by examiner

*Primary Examiner*—Gregory E Webb
(74) *Attorney, Agent, or Firm*—Joseph D. Rossi

(57) ABSTRACT

The present invention relates to an aqueous cleaning composition used to remove unwanted organic and inorganic residues and contaminants from a substrate such as, for example, a semiconductor substrate. The cleaning composition comprises from about 0.01% to about 40% by weight of a salt selected from a guanidinium salt, an acetamidinium salt, a formamidinium salt, and mixtures thereof; water; and optionally a water soluble organic solvent. Compositions according to the present invention are free of an oxidizer and abrasive particles and are capable of removing residues from a substrate and, particularly, a substrate having silicon-containing BARC and/or photoresist residue.

23 Claims, No Drawings

COMPOSITION FOR REMOVAL OF RESIDUE COMPRISING CATIONIC SALTS AND METHODS USING SAME

CROSS-REFERENCE TO RELATED APPLICATIONS

This application claims the benefit of priority under 35 U.S.C. §119(e) to earlier filed U.S. provisional patent application Ser. No. 60/693,205, filed on Jun. 23, 2005, the disclosure of which is incorporated herein by reference in its entirety.

BACKGROUND OF THE INVENTION

The present invention provides cleaning compositions that can be used for a variety of applications including, for example, removing unwanted resist films, post-etch, BARC and post-ash residue on a semiconductor substrate. In particular, the present invention provides cleaning compositions that comprise a salt selected from a guanidinium salt, an acetamidinium salt, a formamidinium salt, and mixtures thereof as a cleaning agent.

The background of the present invention will be described in connection with its use in cleaning applications involving the manufacture of integrated circuits. It should be understood, however, that the use of the present invention has wider applicability.

In the manufacture of integrated circuits, it is sometimes necessary to etch openings or other geometries in a thin film deposited or grown on the surface of silicon, gallium arsenide, glass, or other substrate located on an in-process integrated circuit wafer. Present methods for etching such a film require that the film be exposed to a chemical etching agent to remove portions of the film. The particular etching agent used to remove the portions of the film depends upon the nature of the film. In the case of an oxide film, for example, the etching agent may be hydrofluoric acid. In the case of a polysilicon film, it will typically be hydrofluoric acid or a mixture of nitric acid and acetic acid.

In order to assure that only desired portions of the film are removed, a photolithography process is used, through which a pattern in a computer drafted photo mask is transferred to the surface of the film. The mask serves to identify the areas of the film which are to be selectively removed. This pattern is formed with a photoresist material, which is a light sensitive material spun onto the in-process integrated circuit wafer in a thin film and exposed to high intensity radiation projected through the photo mask. The exposed or unexposed photoresist material, depending on its composition, is typically dissolved with developers, leaving a pattern which allows etching to take place in the selected areas, while preventing etching in other areas. Positive-type resists, for example, have been extensively used as masking materials to delineate patterns on a substrate that, when etching occurs, will become vias, trenches, contact holes, etc.

The trend towards the miniaturization of semiconductor devices has lead to the use of sophisticated multilevel systems to overcome difficulties associated with such miniaturization such as, for example, those noted below. The use of highly absorbing anti-reflective coatings in photolithography is a simpler approach to diminish the problems that result from back reflection of light from highly reflective substrates. Two deleterious effects of back reflectivity are thin film interference and reflective notching. Thin film interference results in changes in critical linewidth dimensions caused by variations in the total light intensity in the resist film as the thickness of the resist changes. Variations of linewidth are proportional to the swing ratio (S) and therefore must be minimized for better linewidth control. Swing ratio is defined as $S=4(R_a R_b)^{1/2} e^{\alpha D}$, where $R_a$ is the reflectivity at the resist/air or resist/top coat interface, $R_b$ is the reflectivity at the resist/substrate interface, $\alpha$ is the resist optical absorption coefficient, and D is the film thickness.

Bottom anti-reflective coatings ("BARC") function by absorbing the radiation used for exposing the photoresist, thus reducing $R_b$ and thereby reducing the swing ratio. Reflective notching becomes severe as the photoresist is patterned over substrates containing topographical features, which scatter light through the photoresist film, leading to linewidth variations, and in the extreme case, forming regions with complete resist loss. Similarly, dyed top anti-reflective coatings reduce the swing ratio by reducing $R_a$, where the coating has the optimal values for refractive index and absorption characteristics, such as absorbing wavelength and intensity.

Increasingly, a dry etching process such as, for example, plasma etching, reactive ion etching, or ion milling is used to attack the photoresist-unprotected area of the substrate to form the vias, trenches, contact holes, etc. As a result of the plasma etching process, photoresist, etching gas and etched material by-products are deposited as residues around or on the sidewall of the etched openings on the substrate.

Such dry etching processes also typically render the resist mask extremely difficult to remove. For example, in complex semiconductor devices such as advanced DRAMS and logic devices with multiple layers of back end lines of interconnect wiring, reactive ion etching (RIE) is used to produce vias through the interlayer dielectric to provide contact between one level of silicon, silicide or metal wiring to the next level of wiring. These vias typically expose, Al, AlCu, Cu, Ti, TiN, Ta, TaN, silicon or a silicide such as, for example, a silicide of tungsten, titanium or cobalt. The RIE process leaves a residue on the involved substrate comprising a complex mixture that may include, for example, re-sputtered oxide material, polymeric material derived from the etch gas, and organic material from the resist used to delineate the vias.

Additionally, following the termination of the etching step, the photoresist (including BARC or other antireflective coating) and etch residues must be removed from the protected area of the wafer so that the final finishing operation can take place. This can be accomplished in a plasma "ashing" step by the use of suitable plasma ashing gases. This typically occurs at high temperatures, for example, above 200° C. Ashing converts most of the organic residues to volatile species, but leaves behind on the substrate a predominantly inorganic residue. Such residue typically remains not only on the surface of the substrate, but also on inside walls of vias that may be present. As a result, ash-treated substrates are often treated with a cleaning composition typically referred to as a "liquid stripping composition" to remove the highly adherent residue from the substrate. Finding a suitable cleaning composition for removal of this residue without adversely affecting, e.g., corroding, dissolving or dulling, the metal circuitry has also proven problematic. Failure to completely remove or neutralize the residue can result in discontinuances in the circuitry wiring and undesirable increases in electrical resistance.

Prior art stripping compositions have included, for example: (a) organic sulfonic acid-based stripping solutions that contain an alkyl benzenesulfonic acid as the main stripping component; and (b) organic amine-based stripping solutions that contain an amine such as monoethanol amine as the main stripping component. Such prior art stripping compositions for removing the etching residue suffer, however, from significant drawbacks. For example, their use tends to erode copper wire exposed on the bottoms of via holes.

Therefore, there is a need in the art for a cleaning composition for back-end cleaning operations including stripping photoresist and plasma ash residues that is capable of selectively removing such residues without etching the underlying and exposed substrate. The underlying and exposed substrate includes, for example, metals, high dielectric constant materials (referred to herein as "high-k"), silicon, silicide and/or interlevel dielectric materials including low dielectric constant materials (referred to herein as "low-k"), such as deposited oxides, HSQ films, MSQ films, Fox films, black diamond films, and tetraethylorthosilicate ("TEOS") films.

BRIEF SUMMARY OF THE INVENTION

The composition disclosed herein is capable of selectively removing residues such as, for example, photoresist, gap fill, BARC and/or other polymeric material, and/or inorganic material and processing residue from a substrate without attacking to any undesired extent metal, low-k dielectric, and/or high-k dielectric materials that might also be exposed to the composition. In certain embodiments, the composition disclosed herein may effectively remove BARC residues from a substrate while providing minimal corrosion to the underlying dielectric material upon exposure.

In one aspect, the present invention provides a composition for removing residues from a substrate, the composition comprising: a salt selected from a guanidinium salt, an acetamidinium salt, a formamidinium salt, and mixtures thereof; water; and optionally a water soluble organic solvent, provided that the composition is free of an oxidizer and is free of abrasive particles.

In another aspect, the present invention provides a composition for removing residues from a substrate comprising BARC comprising: from about 0.01% to about 40% by weight of a salt selected from a guanidinium salt, an acetamidinium salt, a formamidinium salt, and mixtures thereof; water; and optionally a water soluble organic solvent provided that the composition is free of an oxidizer and abrasive particles. In certain embodiments, the composition further comprises at least one selected from the following: a quaternary ammonium compound, a fluoride ion source, an amine, a hydroxylamine or an acid salt thereof; an organic acid, a sulfonic acid or a salt thereof, or a corrosion inhibitor.

In yet another aspect, the present invention provides a method for removing residues comprising BARC from a substrate comprising a dielectric material comprising: contacting the substrate with a composition that comprises: from about 0.01% to about 40% by weight of a salt selected from a guanidinium salt, an acetamidinium salt, a formamidinium salt, and mixtures thereof; water; and optionally a water soluble organic solvent provided that the composition is free of an oxidizer and abrasive particles.

DETAILED DESCRIPTION OF THE INVENTION

The present invention provides a composition whose components are present in amounts that effectively remove residue from a substrate such as, for example, a semiconductor substrate. In applications concerning semiconductor substrates, such residues include, for example, photoresists (hardened or otherwise), gap fill, bottom antireflective coating (BARC) and other polymeric materials (e.g., C—F-containing polymers, low and high molecular weight polymers) and/or processing residues such as the residues generated by etching and ashing processes, inorganic compounds such as metal oxides, ceramic particles from chemical mechanical planarization (CMP) slurries and other inorganic etch residues, metal containing compounds such as, for example, organometallic residues and metal organic compounds. In one embodiment, compositions according to the present invention are particularly effective at removing silicon-containing BARC residues from a semiconductor substrate.

The residues are typically present in a substrate that may include metal, silicon, silicate and/or interlevel dielectric materials such as, for example, deposited silicon oxides and derivatized silicon oxides such as HSQ, MSQ, FOX, TEOS and spin-on glass, chemical vapor deposited dielectric materials, low-k materials and/or high-k materials such as hafnium silicate, hafnium oxide, barium strontium titanate (BST), $TiO_2$, $TaO_5$, wherein both the residues and the metal, silicon, silicide, interlevel dielectric materials, low-k and/or high-k materials will come in contact with the cleaning composition. The compositions according to the present invention are compatible with such materials and, therefore, can be employed to selectively remove residues such as, for example, those described above, without significantly attacking the metal, silicon, silicon dioxide, interlevel dielectric materials, low-k and/or high-k materials. In certain embodiments, the substrate may contain a metal, such as, but not limited to, copper, copper alloy, titanium, titanium nitride, tantalum, tantalum nitride, tungsten, and/or titanium/tungsten alloys.

The compositions according to the present invention are free of an oxidizer, abrasive particles, or any additional component that adversely affects the stripping and cleaning ability of the composition or damages one or more surfaces of the underlying substrate. Examples of oxidizers include, but are not limited to, hydrogen peroxide ($H_2O_2$), monopersulfates, iodates, magnesium perphthalate, peracetic acid and other per-acids, persulfates, bromates, periodates, nitrates, nitric acids, iron salts, cerium salts, Mn (III), Mn (IV) and Mn (VI) salts, silver salts, Cu salts, chromium salts, cobalt salts, halogens hypochlorites and mixtures thereof. Examples of abrasive particles include diamond particles and metal oxides, borides, carbides, alumina, ceria and silica and mixtures thereof. In certain embodiments, the composition is used to remove residues such as abrasive particles contained within CMP solutions from CMP processing. It is preferable that the composition disclosed herein is free of such particles.

The compositions of the present invention are aqueous-based and, thus, comprise water. In the present invention, water functions in various ways such as, for example, as a solvent to dissolve one or more solid components of the composition, as a carrier of the components, as an aid in the removal of the residue, as a viscosity modifier of the composition, and as a diluent.

It is believed that, for most applications, water will comprise, for example, from about 1% to about 95% by weight of the composition. Other preferred compositions according to the present invention comprise from about 1 to about 75% by weight of water. Yet other preferred compositions according to the present invention comprise from about 1 to about 50% by weight of water.

The water component of the present invention can be present incidentally as a component of other elements, such as for example, an aqueous solution comprising the fluoride ion source or quaternary ammonium compound, or it can be added separately. Non-limiting examples of water include deionized (DI) water, ultra pure water, distilled water, doubly distilled water, or deionized water having a low metal content. Preferably, the water in the composition comprises DI water.

The compositions according to the present invention comprise a salt selected from group consisting of a guanidinium salt, an acetamidinium salt, a formamidinium salt, and mixtures thereof. The salt functions as the cleaning agent that principally solubilizes or aids in solubilizing organic residue that is present on the substrate. These salts contain one of the following cations represented by the following formulas (I) through (III) which is the guanidium cation, formadinium cation, or acetamidinium cation, respectively, wherein m is 1 or 2:

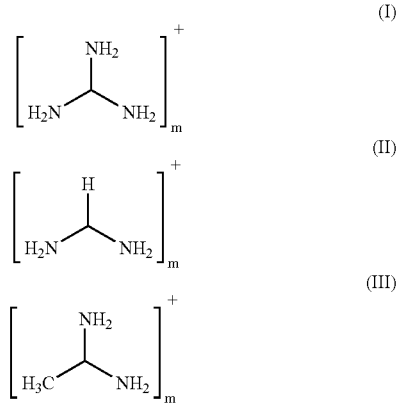

Exemplary anions to form the salt include but are not limited to halides such as Cl—, Br—, F—, I—; sulfides; sulfites; sulfates, carbonates, nitrites, acetates, and other anions know to those skilled in the art. Acid sources to supply such anions include, but are not limited to, hydrochloric acid, hydrobromic acid, hydrofluoric acid, hydrosulphuric acid, sulphurous acid, or sulphuric acid.

Preferred salts for use in compositions according to the present invention include, but are not limited to, guanidine hydrochloride, guanidine sulfate, amino-guanidine hydrochloride, guanidine acetic acid, guanidine carbonate, guanidine nitrate, formanimide, formamidinesulfinic acid, formamidine acetate, aminoguanidine carbonate, aminoguanidine carbonate hydrochloride, formamidine chloride, and mixtures thereof.

It is believed that, for most applications, the amount of the salt will comprise from about 0.01% to about 40% by weight of the composition. Preferably, the salt comprises from about 0.01% to about 30% and, more preferably, from about 0.01% to about 25% by weight of the composition.

The compositions according to the present invention optionally comprises at least one organic solvent. The organic solvent is preferably miscible with water. In various embodiments of the present invention, metal lines on the substrate typically dictate whether a water-miscible organic solvent is used. For example, when aluminum lines are present on a substrate, the combination of water and halide ion will typically tend to etch the aluminum. In such embodiments, the use of water-miscible organic solvent can significantly reduce, if not eliminate, etching of aluminum.

Examples of water-miscible organic solvents include, but are not limited to, dimethylacetamide (DMAC), N-methyl pyrrolidinone (NMP), dimethylsulfoxide (DMSO), dimethylformamide, N-methylformamide, formamide, dimethyl-2-piperidone (DMPD), tetrahydrofurfuryl alcohol, glycerol, ethylene glycol, and other amides, alcohols or sulfoxides, or multifunctional compounds, such as hydroxyamides or amino alcohols. Further examples of the water-miscible organic solvents include diols and polyols such as ($C_2$-$C_{20}$) alkanediols and ($C_3$-$C_{20}$) alkanetriols, cyclic alcohols and substituted alcohols. Particular examples of these water-miscible organic solvents include propylene glycol, tetrahydrofurfuryl alcohol, diacetone alcohol and 1,4-cyclohexanedimethanol. In certain embodiments, the water-miscible organic solvent may be DMSO, NMP, and/or DMAC. The water-miscible organic solvents enumerated above may be used alone or in combination with two or more solvents.

In certain preferred embodiments of the present invention, the water-miscible organic solvent may comprise a glycol ether. Examples of glycol ethers include ethylene glycol monomethyl ether, ethylene glycol monoethyl ether, ethylene glycol monobutyl ether, ethylene glycol dimethyl ether, ethylene glycol diethyl ether, diethylene glycol monomethyl ether, diethylene glycol monoethyl ether, diethylene glycol monopropyl ether, diethylene glycol monoisopropyl ether, diethylene glycol monobutyl ether, diethylene glycol monoisobutyl either, diethylene glycol monobenzyl ether, diethylene glycol dimethyl ether, diethylene glycol diethyl ether, triethylene glycol monomethyl ether, triethylene glycol dimethyl ether, polyethylene glycol monomethyl ether, diethylene glycol methyl ethyl ether, triethylene glycol ethylene glycol monomethyl ether acetate, ethylene glycol monethyl ether acetate, propylene glycol methyl ether acetate, propylene glycol monomethyl ether, propylene glycol dimethyl ether, propylene glycol monobutyl ether, propylene glycol, monopropyl ether, dipropylene glycol monomethyl ether, dipropylene glycol monopropyl ether, dipropylene glycol monoisopropyl ether, dipropylene monobutyl ether, diproplylene glycol diisopropyl ether, tripropylene glycol monomethyl ether, 1-methoxy-2-butanol, 2-methoxy-1-butanol, 2-methoxy-2-methylbutanol, 1,1-dimethoxyethane and 2-(2-butoxyethoxy)ethanol.

It is believed that, for most applications, the amount of water-miscible organic solvent will comprise from about 0% to about 60% by weight of the compositon. Preferably, the water-miscible solvent comprises from about 0 to about 55% by weight and, more preferably, from about 0 to about 50% by weight of the composition.

Compositions according to the present invention may optionally comprise a quaternary ammonium compound. If employed, the quaternary ammonium compound functions to assist in the removal of organic and inorganic residues.

Examples of quaternary ammonium compounds for use in compositions according to the present invention are quaternary ammonium compounds having the formula [N—$R_1R_2R_3R_4$]$^+$ OH$^-$ wherein $R_1$, $R_2$, $R_3$, and $R_4$ are each independently an alkyl group of 1 to 20 carbon atoms. The term "alkyl" refers to straight or branched chain unsubstantiated hydrocarbon groups of 1 to 20 carbon atoms, or from 1 to 8 carbon atoms, or from 1 to 4 carbon atoms. Examples of suitable alkyl groups include methyl, ethyl, propyl, isopropyl, butyl, and tertbutyl. The expression "lower alkyl" refers to alkyl groups of 1 to 4 carbon atoms. Examples of suitable quaternary ammonium compounds include tetramethylammonium hydroxide (TMAH), tetraethylammonium hydroxide, tetrabutylammonium hydroxide (TBAH), tetrapropylammonium hydroxide, trimethylethylammonium hydroxide, (2-hydroxyethyl)trimethylammonium hydroxide, (2-hydroxyethyl)triethylammonium hydroxide, (2-hydroxyethyl)tripropylammonium hydroxide, (1-hydroxypropyl)trimethylammonium hydroxide, ethyltrimethylammonium hydroxide, diethyldimethylammonium hydroxide and benzyltrimethylammonium hydroxide.

It is believed that, for most applications, the amount of the quaternary ammonium compound will comprise from about 0% to about 50% by weight of the composition. Preferably, the quaternary ammonium compound comprises from about 0% to about 40% by weight and, more preferably, from about 0 to 30% by weight of the composition.

Compositions according to the present invention may optionally comprise at least one fluoride ion source. The fluoride ion functions principally to assist in removing inorganic residues from the substrate. Typical compounds that provide a fluoride ion source according to the present invention are hydrofluoric acid and salts thereof, ammonium fluoride, quaternary ammonium fluorides such as, for example, tetramethylammonium fluoride and tetrabutylammonium fluoride, fluoroborates, fluoroboric acid, tetrabutylammonium tetrafluoroborate, and aluminum hexafluoride. Also, a fluoride salt of an aliphatic primary, secondary or tertiary amine can be used, for example, an amine of the formula $R_5R_6R_7R_8NF$ where $R_5$, $R_6$, $R_7$, and $R_8$ are each independently hydrogen, an alkanol group, an alkoxy group, an alkyl group or mixtures thereof. Examples of such compounds include ammonium fluoride, tetramethyl ammonium fluoride, tetraethyl ammonium fluoride, tetrabutyl ammonium fluoride, and mixtures thereof. Still further examples of fluoride ion sources include fluoroboric acid, hydrofluoric acid, fluoroborates, fluoroboric acid, tetrabutylammonium tetrafluoroborate, aluminum hexafluoride, and choline fluoride. In still further embodiments, the fluoride ion source is a fluoride salt of an aliphatic primary, secondary or tertiary amine can be used.

In a preferred embodiment, the fluoride ion source is an alkyl fluoride such as, for example, tetramethyl ammonium fluoride, tetraethyl ammonium fluoride, tetrabutyl ammonium fluoride, and mixtures thereof.

In selecting the source of the fluoride ion, consideration should be given as to whether or not the source would tend to release ions which would tend to affect adversely the surface being cleaned. For example, in cleaning semiconductor elements, the presence of sodium or calcium ions in the cleaning composition can have an adverse effect on the surface of the element.

It is believed that the amount of the compound used as the source of the fluoride ion in the cleaning composition will, for the most applications, comprise from about 0 to about 10% by weight. More preferably, the compound comprises from about 0 to about 5% by weight of the composition. It should be understood that the amount of fluoride ion used will typically depend, however, on the particular substrate being cleaned. For example, in certain cleaning applications, the amount of the fluoride ion can be relatively high when cleaning substrates that comprise dielectric materials that have a high resistance to fluoride etching. Conversely, in other applications, the amount of fluoride ion should be relatively low, for example, when cleaning substrates that comprise dielectric materials that have a low resistance to fluoride etching.

Compositions according to the present invention may optionally comprise at least one amine compound. If employed, the amine compound functions to aid in the removal of certain organic residues such as, for example, organic polymer residue such as, for example, resists.

Amine compounds suitable for use in the present invention include, for example, alkanolamines, alkyl amines, cyclic non-aromatic amines, compounds represented by the formula $NR_9R_{10}R_{11}$ wherein $R_9$, $R_{10}$ and $R_{11}$ are each independently selected from the group consisting of H, aliphatic group, ether group, alkylmonoamino group, alkyldiamino group, alkyltriamino group, and a N-heterocyclic group optionally containing at least one additional hetero atom selected from the group consisting of N, O and S in the ring, and other amine compounds.

In preferred embodiments of the present invention, the amine compound is an alkanolamine. Preferred alkanolamines include the lower alkanolamines which are primary, secondary and tertiary having from 1 to 5 carbon atoms. Examples of such alkanolamines include N-methylethanolamine (NMEA), monoethanolamine (MEA), diethanolamine, mono-, di- and triisopropanolamine, 2-(2-aminoethylamino) ethanol, 2-(2-aminoethoxy)ethanol, triethanolamine, and the like. Other preferred amines include cyclic non-aromatic amines such as morpholine, cyclohexylamine, and piperidine lower alkylamines such as butylamine, lower alkylene diamines such as ethylene diamine, and the like.

In other preferred embodiments of the present invention, the amine compound is a compound represented by the formula $NR_9R_{10}R_{11}$ wherein each $R_9$, $R_{10}$ and $R_{11}$ are each independently selected from the group consisting of H, aliphatic group, ether group, alkylmonoamino group, alkyldiamino group, alkyltriamino group, and a N heterocyclic group optionally containing at least one additional hetero atom selected from the group consisting of N, O and S in the ring, and other amine compounds. Examples of such amines include, for example, aminoalkylmorpholines such as aminopropylmorpholine and aminoalkylpiperazines such as aminoethylpiperazine. With reference to the preceeding amine compound formula, suitable aliphatic groups include straight or branched chain alkyl groups, alkylene groups, alkyne, aryl, aryl-alkyl, alkyl-aryl and substituted aryl groups. Ether groups include acrylic ethers typically having from 1 to 12 carbon atoms. Examples of some ether groups are methoxy, ethoxy, propoxy, butoxy, isopropoxy, isobutoxy, sec-butoxy and tert-butoxy. Amino groups include primary, secondary and tertiary amines as well as higher alkyl amino functionality such as di- and tri-amines.

It is believed that the amount of the amine compound in the composition will, for the most applications, comprise from about 0% to about 20% by weight of the composition. Preferably, the amine compound comprises from about 0% to about 10% weight percent and, more preferably, from about 0 to 5% by weight of the composition.

As used herein, the term "alkyl" refers to straight or branched chain unsubstituted hydrocarbon groups of 1 to 20 carbon atoms or from 1 to 10 carbon atoms. As used herein, the terms "alkenyl" and "alkynyl" refer to straight or branched chain unsaturated hydrocarbon groups typically having 2 to 8 carbon atoms. As used herein, the term "aryl" refers to monocyclic or bicyclic aromatic hydrocarbon groups having 6 to 12 carbon atoms in the ring portion, such as phenyl, naphthyl, biphenyl and diphenyl groups, each of which may be substituted. Examples of some monocyclic heterocyclic groups typically contain 5 or 6 atoms in the ring and include morpholino, piperazine, isothiazole, imidazoline, pyrazoline, pyrazolidine, pyrimidine, pyrazine. As used herein, the term "aralkyl" or "alkylaryl" refers to an aryl group bonded directly to an alkyl group, such as benzyl or phenethyl. As used herein, the term "substituted aryl" or "substituted alkylaryl" refers to an aryl group or alkylaryl group substituted by, for example, one to four substituents such as alkyl; substituted alkyl, halo, trifluoromethoxy, trifluoromethyl, hydroxy, alkoxy, azido, cycloalkyloxy, heterocyclooxy, alkanoyl, alkanoyloxy, amino, alkylamino, aralkylamino, hydroxyalkyl, aminoalkyl, azidoalkyl, alkenyl, alkynyl, allenyl, cycloalkylamino, heterocycloamino, dialkylamino, thiol, alkylthio, cycloalkylthio, heterocyclothio, ureido, nitro, cyano, carboxy, carboxyalkyl, carbamyl, alkoxycarbonyl, alkylthiono, arylthiono, alkylsulfonyl, sulfonamide, aryloxy and the like. The substituent may be further substituted by halo, hydroxy, alkyl, alkoxy, aryl, substituted aryl, substituted alkyl or aralkyl. As used herein, the term "substituted benzyl" refers to a benzyl group substituted by, for example, any of the groups listed above for substituted aryl. These definitions apply to the terms as they are used throughout this specification, unless otherwise limited in specific instances, either individually or as part of a larger group.

Compositions according to the present invention may optionally comprise at least one hydroxylamine compound or an acid salt thereof. If employed, the hydroxylamine functions to assist in the corrosion inhibition of copper. Exemples of hydroxylamines for use according to the present invention include diethylhydroxylamine and the lactic acid and citric acid salts thereof.

It is believed that the amount of the hydroxylamine compound in the composition will, for the most applications, comprise from about 0% to about 5% by weight of the composition. Preferably, the hydroxylamine compound, if employed, comprises from about 0.1% to about 5% weight percent of the composition.

Compositions according to the present invention may optionally comprise at least one organic acid. If employed, the organic acid functions as a corrosion inhibitor. Exemplary organic acids include citric acid, anthranilic acid, gallic acid, benzoic acid, malonic acid, maleic acid, fumaric acid, D,L-malic acid, isophthalic acid, phthalic acid, and lactic acid.

It is believed that the amount of the organic acid in the composition will, for the most applications, comprise from about 0% to about 10% by weight of the composition. Preferably, the organic acid comprises from about 0% to about 2% weight percent of the composition.

Compositions according to the present invention may optionally comprise at least one sulfonic acid. If employed, the sulfonic acid functions as a cleaning aid and as a corrosion inhibitor. Examples of sulfonic acids suitable for use in the present invention include p-toluenesulfonic acid, 1,5-naphthalenedisulfonic acid, 4-ethylbenzenesulfonic acid, anilinesulfonic acid, aniline-2-sulfonic acid, dodecylbenzenesulfonic acid, cumensulfonic acid, methylethylbenzenesulfonic acid, isomers of xylenesulfonic acid and the corresponding salts of the sulfonic acids listed above. Examples of salts of sulfonic acids includes ethanolammonium p-toluenesulfonate and triethanolammonium p-toluenesulfonate. The sulfonic acid or its corresponding salts can be present in the compositions as a single acid or salt, or mixture of sulfonic acids or corresponding salts.

It is believed that the amount of the sulfonic acid in the composition will, for the most applications, comprise from about 0% to about 20% by weight of the composition. Preferably, the sulfonic acid comprises from about 0% to about 10% by weight and, more preferably, from about 0% to about 5% of the composition.

Compositions according to the present invention may optionally comprise at least one corrosion inhibitor. The use of a corrosion inhibitor is preferred when the composition is used to clean a metallic substrate. Examples of corrosion inhibitors include aromatic hydroxyl compounds, acetylenic alcohols, carboxyl group-containing organic compounds and anhydrides thereof, and triazole compounds.

Exemplary aromatic hydroxyl compounds include phenol, cresol, xylenol, pyrocatechol, resorcinol, hydroquinone, pyrogallol, 1,2,4-benzenetriol, salicyl alcohol, p-hydroxybenzyl alcohol, o-hydroxybenzyl alcohol, p-hydroxyphenethyl alcohol, p-aminophenol, m-aminophenol, diaminophenol, amino resorcinol, p-hydroxybenzoic acid, o-hydroxybenzoic acid 2,4-dihydroxybenzoic acid, 2-5-dihydroxybenzoic acid, 3,4-dihydroxybenzoic acid and 3,5-dihydroxybenzoic acid.

Exemplary acetylenic alcohols include 2-butyne-1,4-diol, 3,5-dimethyl-1-hexyn-3-ol, 2 methyl-3-butyn-2-ol, 3-methyl-1-pentyn-3-ol, 3,6-dimethyl-4-octyn-3,6-diol, 2,4-7,9-tetramethyl-5-decyne-4,7-diol and 2,5-dimethyl-3-hexyne 2,5-diol.

Exemplary carboxyl group-containing organic compounds and anhydrides thereof include formic acid, acetic acid, propionic acid, butyric acid, isobutyric acid, oxalic acid, malonic acid, succinic acid, glutaric acid, maleic acid, fumaric acid, benzoic acid, phthalic acid, 1,2,3-benzenetricarboxylic acid, glycolic acid, lactic acid, maleic acid citric acid, acetic anhydride and salicylic acid.

Exemplary triazole compounds include benzotriazole, o-tolyltriazole, m-tolyltriazole, p-tolyltriazole, carboxybenzotriazole, 1-hydroxybenzotriazole, nitrobenzotriazole and dihydroxypropylbenzotriazole.

Preferred inhibitors are catechol, gallic acid, benzotriazole, pyrogallol, 4-methyl catechol fumaric acid and diethylhydroxylamine (DEHA); it is preferred that an inhibitor other than benzotriazole be used when cleaning a substrate comprising copper because benzotriazole has a tendency to bind to copper.

It is believed that for most applications, the corrosion-inhibitor will comprise from about 0.01 to about 5% by weight of the composition; preferably it comprises from about 0.01 to about 4% by weight, most preferably, from about 0.01 about 3% by weight of the composition.

Preferred corrosion inhibitors according to the present invention include organic acid salts, benzotriazole (BZT), resorcinol, other phenols, acids or triazoles maleic anhydride, phthalic anhydride, catechol, pyrogallol, esters of gallic acid, carboxybenzotriazole, fructose, ammonium thiosulfate, glycine, tetramethylguanidine, iminodiacetic acid, dimethylacetoacetamide, trihydroxybenzene, dihydroxybenzene, salicyclohydroxamic, and mixtures thereof.

The composition may also include one or more of the following additives: surfactants, chelating agents, chemical modifiers, dyes, biocides, and other additives. Additives may be added to the composition described herein provided that it does not adversely affect the stripping and cleaning ability of the composition or the integrity of the underlying metal, silicon, silicon dioxide, interlevel dielectric materials, low-k and/or high-k materials. For example, if the composition if used to treat a substrate containing copper, the composition does not include additional additives that would increase the copper etch rate of the composition. Some examples of representative additives include acetylenic alcohols and derivatives thereof, acetylenic diols (non-ionic alkoxylated and/or self-emulsifiable acetylenic diol surfactants) and derivatives thereof, alcohols, quaternary amines and di-amines, amides (including aprotic solvents such as dimethyl formamide and dimethyl acetamide), alkyl alkanolamines (such as diethanolethylamine), and chelating agents such as beta-diketones, beta-ketoimines, carboxylic acids, mallic acid and tartaric acid based esters and diesters and derivatives thereof, and tertiary amines, diamines and triamines.

In one embodiment of the present invention, the present invention provides a composition for removing residues from a substrate comprising a BARC, the composition comprising: from about 0.01% to about 40% by weight of a salt selected from a guanidinium salt, an acetamidinium salt, a formamidinium salt, and mixtures thereof; water; and optionally a water soluble organic solvent. In certain embodiments, the composition further comprises at least one selected from the following: a quatenary ammonium compound, a fluoride ion source, an amine, a hydroxylamine or an acid salt thereof; an organic acid, sulfonic acid or a salt thereof, or a corrosion inhibitor. The pH of the composition disclosed herein may range from 4 to 12.5, or from 5 to 12.5, of from 6.5 to 12.5.

The cleaning composition of the present invention is typically prepared by mixing the components together in a vessel at room temperature until all solids have dissolved in the aqueous-based medium.

Compositions disclosed herein are compatible with substrates containing low-k films such as HSQ (FOx), MSQ, SiLK, etc. including those low-k films containing a fluoride. The compositions are also effective in stripping photoresists including positive and negative photoresists and plasma etch residues such as organic residues, organometallic residues, inorganic residues, metallic oxides, or photoresist complexes at low temperatures with very low corrosion of copper, and/or titanium containing substrates. Moreover, the compositions are compatible with a variety of metal, silicon, silicon dioxide, interlevel dielectric materials, low-k and/or high-k materials.

During the manufacturing process, a photoresist layer is coated on the substrate. Using a photolithographic process, a pattern is defined on the photoresist layer. The patterned photoresist layer is thus subjected to plasma etch by which the pattern is transferred to the substrate. Etch residues are generated in the etch stage. Some of the substrates used in this invention are ashed while some are not ashed. When the substrates are ashed, the main residues to be cleaned are etchant residues. If the substrates are not ashed, then the main residues to be cleaned or stripped are both etch residues and photoresists.

The method described herein may be conducted by contacting a substrate having a metal, organic or metal-organic polymer, inorganic salt, oxide, hydroxide, or complex or combination thereof present as a film or residue, with the described composition. The actual conditions, e.g., temperature, time, etc., depend, on the nature and the thickness of the material to be removed. In general, the substrate is contacted or dipped into a vessel containing the composition at a temperature ranging from 20° C. to 85° C., or from 20° C. to 60° C., or from 20° C. and 40° C. Typical time periods for exposure of the substrate to the composition may range from, for example, 0.1 to 60 minutes, or 1 to 30 minutes, or 1 to 15 minutes. After contact with the composition, the substrate may be rinsed and then dried. Drying is typically carried out under an inert atmosphere. In certain embodiments, a deionized water rinse or rinse containing deionized water with other additives may be employed before, during, and/or after contacting the substrate with the composition described herein. However, the composition can be used in any method known in the art that utilizes a cleaning fluid for the removal of photoresist, ash or etch residues and/or residues.

It will be appreciated by those skilled in the art that the composition of the present invention may be modified to achieve optimum cleaning without damaging the substrate so that high throughput cleaning can be maintained in the manufacturing process. For example, one skilled in the art would appreciate that, for example, modifications to the amounts of some or all of the components may be made depending upon the composition of the substrate being cleaned, the nature of the residue to be removed, and the particular process parameters used.

Although the present invention has been principally described in connection with cleaning semiconductor substrates, the cleaning compositions of the invention can be employed to clean any substrate that includes organic and inorganic residues.

The following examples are provided for the purpose of further illustrating the present invention but are by no means intended to limit the same.

EXAMPLES

In the following examples, all amounts are given in weight percent and add up to 100 weight percent. The compositions disclosed herein were prepared by mixing the components together in a vessel at room temperature until all solids have dissolved. Examples of certain compositions disclosed herein are set forth in Table I.

The following are the acronyms used in Table I:

| | |
|---|---|
| APM | Aminopropylmorpholine |
| t-PGME | tripropyleneglycol methyl ether |
| DPM (or d-PGME) | Dipropylene glycol methyl ether |
| THFA | tetrahydrofurfuryl alcohol |
| TMAH | Tetramethyl ammonium hydroxide |
| PGME | propyleneglycol methyl ether |
| DI water | Deionized water |
| DEHA | diethylhydroxyamine |
| MEA | Ethanolamine |
| NMEA | N-methylethanolamine |
| DMSO | Dimethylsulfoxide |
| NMP | N-methylpyrollidine |
| PG | Propylene glycol |
| TMAF | Tetramethyl ammonium Fluoride |
| BZT | Benzotriazole |
| TME | Tetramethoxyethane |

TABLE I

Exemplary Compositions

Example A

| | |
|---|---|
| DI Water | 40 |
| TMAF (20%) | 1.5 |
| Anilinesulfonic acid | 0.5 |
| DEHA | 4 |
| citric acid (29%) | 2 |
| TMAH (25%) | 42 |
| guanidine carbonate | 10 |

Example B

| | |
|---|---|
| DI Water | 34 |
| TMAF (20%) | 1.5 |
| Anilinesulfonic acid | 0.5 |
| DEHA | 0 |
| citric acid (29%) | 4 |
| TMAH (25%) | 47 |
| guanidine carbonate | 13 |

Example C

| | |
|---|---|
| DI Water | 24 |
| TMAF (20%) | 1.5 |
| Anilinesulfonic acid | 0.5 |
| DEHA | 0 |
| citric acid (29%) | 4 |
| TMAH (25%) | 57 |
| guanidine carbonate | 13 |

Example D

| | |
|---|---|
| DI Water | 37 |
| TMAF (20%) | 1.5 |
| Anilinesulfonic acid | 0.5 |
| DEHA | 4 |
| citric acid (29%) | 2 |
| TMAH (25%) | 30 |
| guanidine carbonate | 10 |
| PGME | 15 |

Example E

TABLE I-continued

Exemplary Compositions

| Component | Amount |
|---|---|
| DI Water | 37 |
| TMAF (20%) | 1.5 |
| Anilinesulfonic acid | 0.5 |
| DEHA | 4 |
| citric acid (29%) | 2 |
| TMAH (25%) | 30 |
| guanidine carbonate | 10 |
| THFA | 15 |

Example F

| Component | Amount |
|---|---|
| DI Water | 25 |
| TMAF (20%) | 1.5 |
| Anilinesulfonic acid | 0.5 |
| DEHA | 4 |
| citric acid (29%) | 2 |
| TMAH (25%) | 34 |
| guanidine carbonate | 13 |
| THFA | 20 |

Example G

| Component | Amount |
|---|---|
| DI Water | 25 |
| TMAF·4H$_2$O | 3 |
| Anilinesulfonic acid | 2.2 |
| DEHA | 5 |
| citric acid (29%) | 3 |
| TMAH (25%) | 29 |
| guanidine sulfate | 3 |
| PGME | 29.8 |

Example H

| Component | Amount |
|---|---|
| DI Water | 33 |
| TMAF (20%) | 0 |
| Anilinesulfonic acid | 2 |
| citric acid (29%) | 2 |
| TMAH (25%) | 40 |
| guanidine carbonate | 13 |
| t-PGME | 10 |

Example I

| Component | Amount |
|---|---|
| DI Water | 36 |
| cobratec 948 | 3 |
| TMAH (25%) | 26 |
| Octylamine | 0.6 |
| HCl (37%) | 9.8 |
| aminoguanidine carbonate/HCl | 11 |
| d-PGME | 13.6 |

Example J

| Component | Amount |
|---|---|
| DI Water | 30 |
| cobratec 948 | 3 |
| TMAH (25%) | 22 |
| Octylamine | 0.5 |
| HCl (37%)) | 12.5 |
| Formamidine acetate/HCl | 9 |
| d-PGME | 23 |

Example K

| Component | Amount |
|---|---|
| DI Water | 36 |
| Cobratec 948 | 3 |
| TMAH (25%) | 26 |
| Octylamine | 0.6 |
| guanidine carb/H$_2$SO$_4$ (78%) | 17 |
| d-PGME | 17.4 |

Example L

| Component | Amount |
|---|---|
| d-PGME | 49 |
| DI Water | 34.5 |
| Amm. Fluoride (40%) | 1.8 |
| PG | 8 |
| guanidine sulfate | 4.2 |
| BZT | 2.5 |

Example M

| Component | Amount |
|---|---|
| d-PGME | 49 |
| DI Water | 41 |
| Amm. Fluoride (40%) | 2 |
| guanidine sulfate | 5 |
| BZT | 3 |

Example N

| Component | Amount |
|---|---|
| d-PGME | 54 |
| DI Water | 36 |
| Amm. Fluoride (40%) | 2 |
| guanidine sulfate | 5 |
| BZT | 3 |

Example O

| Component | Amount |
|---|---|
| d-PGME | 53 |
| DI Water | 36 |
| Amm. Fluoride (40%) | 3 |
| guanidine sulfate | 5 |
| BZT | 3 |

Example P

| Component | Amount |
|---|---|
| Nonylamine | 1 |
| TMAF (20%) | 0.75 |
| Glycerol | 15 |
| BZT | 2 |
| TMAH (25%) | 20 |
| guanidine carbonate | 10 |
| d-PGME | 20 |
| DI Water | 31.25 |

Example Q

| Component | Amount |
|---|---|
| Decylamine | 1 |
| TMAF (20%) | 0.75 |
| Glycerol | 15 |
| BZT | 2 |
| TMAH (25%) | 20 |
| guanidine carbonate | 10 |
| d-PGME | 20 |
| DI Water | 31.25 |

Example R

| Component | Amount |
|---|---|
| DI Water | 33 |
| TMAF (20%) | 1.5 |
| Aniline-2-sulfonic acid | 0.5 |
| TMAH (25%) | 35 |
| BZT | 1.8 |
| PG | 10 |
| Formamidine acetate | 10 |
| d-PGME | 8.2 |

Example S

| Component | Amount |
|---|---|
| DI Water | 33 |
| TMAF (20%) | 1.5 |
| Aniline-2-sulfonic acid | 0.5 |
| TMAH (25%) | 25 |
| BZT | 1.8 |
| PG | 5 |
| Guanidine carbonate | 10 |
| TME | 23.2 |

Example T

| Component | Amount |
|---|---|
| DI Water | 33 |
| TMAF (20%) | 1.5 |
| Aniline-2-sulfonic acid | 0.5 |
| TMAH (25%) | 35 |
| BZT | 1.8 |
| PG | 10 |
| Guanidine carbonate | 10 |
| TME | 8.2 |

Example U

| Component | Amount |
|---|---|
| DI Water | 33 |
| TMAF (20%) | 2.5 |
| Aniline-2-sulfonic acid | 0.5 |
| TMAH (25%) | 35 |
| BZT | 1.8 |
| PG | 5 |
| Guanidine carbonate | 10 |
| TME | 12.2 |

Example V

TABLE I-continued

Exemplary Compositions

| | |
|---|---|
| DI Water | 24 |
| TMAH (25%) | 48 |
| Guanidine carbonate | 18 |
| DMSO | 10 |
| Example W | |
| DI Water | 24 |
| TMAH (25%) | 48 |
| Guanidine carbonate | 18 |
| NMP | 10 |
| Example X | |
| DI Water | 33 |
| TMAF (20%) | 1.5 |
| Aniline-2-sulfonic acid | 0.5 |
| TMAH (25%) | 35 |
| BZT | 1.8 |
| PG | 10 |
| Formamidine chloride | 10 |
| d-PGME | 8.2 |
| Example Y | |
| NMEA | 18 |
| TMAH (25%) | 35 |
| Guanidine carbonate | 18 |
| DI Water | 29 |
| Example Z | |
| MEA | 18 |
| TMAH (25%) | 35 |
| Guanidine carbonate | 18 |
| DI Water | 29 |
| Example A1 | |
| APM | 18 |
| TMAH (25%) | 35 |
| Guanidine carbonate | 18 |
| DI Water | 29 |
| Example A2 | |
| APM | 7.40 |
| DPM | 18.50 |
| Octylamine | 0.01 |
| TMAH (25%) | 30.70 |
| Guanidine carbonate | 11.10 |
| DI Water | 32.29 |
| Example A3 | |
| APM | 4.80 |
| DPM | 18.10 |
| Octylamine | 0.10 |
| TMAH (25%) | 35.00 |
| Guanidine carbonate | 13.00 |
| DI Water | 29.00 |
| Example A4 | |
| APM | 4.80 |
| DPM | 18.10 |
| Octylamine | 0.10 |
| TMAH (25%) | 25.00 |
| Guanidine carbonate | 11.00 |
| DI Water | 41.00 |

Compositions of the Substrate

Each substrate used in the present Examples comprised three layers. The first (i.e., the bottom layer) was an ILD material comprising BLACK DIAMOND II™. The next layer was a silicon-containing BARC (193 nm) and the top layer was a photoresist (193 nm). The substrates were then subjected to plasma etching Processing Conditions Cleaning tests were run using 305 mL of the cleaning compositions in a 400 mL beaker with a ½" round Teflon stir bar set at 600 rpm. The cleaning compositions were heated to the desired temperature indicated below on a hot plate if necessary. Wafer segments approximately ½"×½" in size were immersed in the compositions under the following set of conditions.

10 minutes @ 25° C.

20 minutes @ 25° C.

10 minutes @ 35° C.

20 minutes @ 35° C.

The segments were then rinsed for 3 minutes in a DI water overflow bath and subsequently dried using filtered nitrogen. They were then analyzed for cleanliness using SEM microscopy.

TABLE II

Cleaning Data

| | BARC | | Photo-resist | |
|---|---|---|---|---|
| Formulations | 248 nm | 193 nm | 248 nm | 193 nm |
| Example A | ✓ | ✓ | ✓ | ✓- |
| Example B | ✓ | ✓ | ✓ | ✓- |
| Example C | ✓ | ✓ | ✓ | ✓- |
| Example D | ✓ | ✓ | ✓ | ✓- |
| Example E | ✓ | ✓ | ✓ | ✓- |
| Example F | ✓ | ✓- | ✓ | ✓- |
| Example G | ✓ | ✓- | ✓ | ✓- |
| Example H | ✓ | ✓- | ✓ | ✓- |
| Example I | ✓ | X | ✓ | X |
| Example J | ✓ | X | ✓ | X |
| Example K | ✓ | ✓- | ✓ | X |
| Example L | ✓ | X | ✓ | X |
| Example M | ✓ | X | ✓ | X |
| Example N | ✓ | X | ✓ | X |
| Example O | ✓ | X | ✓ | X |
| Example P | ✓ | ✓ | ✓ | ✓- |
| Example Q | ✓ | ✓ | ✓ | ✓- |
| Example R | ✓ | X | ✓ | X |
| Example S | ✓ | ✓- | ✓ | ✓- |
| Example T | ✓ | ✓ | ✓ | ✓- |
| Example U | ✓ | ✓ | ✓ | ✓- |
| Example V | ✓ | ✓- | ✓ | ✓- |
| Example W | ✓ | ✓- | ✓ | ✓- |
| Example X | ✓ | X | ✓ | X |
| Example Y | ✓ | X | ✓ | X |
| Example Z | ✓ | X | ✓ | X |
| Example A1 | ✓ | ✓- | ✓ | ✓ |
| Example A2 | ✓ | ✓ | ✓ | ✓ |
| Example A3 | ✓ | ✓ | ✓ | ✓ |
| Example A4 | ✓ | ✓ | ✓ | ✓ |

✓ = successful
✓- = partially successful
X = unsuccessful

Table II illustrates the effectiveness of compositions according to the present invention at removing a BARC residue and a photoresist residue.

Etch Rate Measurement Procedure

Coupons of blanket Cu, Co, and W wafers were measured for metal layer thickness by measuring the resistivity of the layer by employing a ResMap™ model 273 resistivity instrument from Creative Design Engineering, Inc. The coupons were then immersed in the composition at the desired temperature for up to one hour. Periodically the coupons were removed from the composition, rinsed with de-ionized water and dried and the thickness of the metal layer was again measured. A graph of the change in thickness as a function of immersion time was made and the etch rate in Angstroms/min was determined from the slope of the curve.

TABLE III

Cleaning and Etching Data

| Formulations | Etch Rate BARC 193 nm (Å/min) | Etch Rate Cu (Å/min) | Etch Rate Co (Å/min) | Etch Rate W (Å/min) |
|---|---|---|---|---|
| Example A | 1867 | 8 | NT | NT |
| Example B | NT | 12 | NT | 2 |
| Example C | NT | 12 | NT | 1 |
| Example H | NT | 25 | NT | 3 |
| Example I | 19 | NT | NT | NT |
| Example J | 1 | NT | NT | NT |
| Example K | 378 | 10 | 1 | NT |
| Example M | 1 | NT | NT | NT |
| Example O | 1 | NT | NT | NT |
| Example Q | 181 | NT | NT | NT |
| Example A2 | NT | 10 | NT | 0 |
| Example A3 | 91 | 6 | 24 | NT |
| Example A4 | 191 | NT | NT | NT |

NT = not tested

Table III illustrates the effectiveness of certain of the compositions according to the present invention at selectively removing residue without significantly etching the metal substrate.

The foregoing examples and description of the preferred embodiments should be taken as illustrating, rather than as limiting the present invention as defined by the claims. As will be readily appreciated, numerous variations and combinations of the features set forth above can be utilized without departing from the present invention as set forth in the claims. Such variations are not regarded as a departure from the spirit and scope of the invention, and all such variations are intended to be included within the scope of the following claims.

The invention claimed is:

1. A composition for removing residues from a substrate, the composition comprising:
    a salt selected from a guanidinium salt, an acetamidinium salt, a formamidinium salt, and mixtures thereof;
    water; and
    a water-miscible organic solvent selected from the group consisting of dimethylacetamide, N-methyl pyrrolidinone, dimethylsulfoxide, dimethylformamide, N-methylformamide, formamide, dimethyl-2-piperidone, tetrahydrofurfuryl alcohol, a glycol ether, glycerol, and mixtures thereof,
    provided that the composition is free of an oxidizer and is free of abrasive particles.

2. The composition of claim 1 further comprising a corrosion inhibitor.

3. The composition of claim 2 wherein the corrosion inhibitor comprises at least one selected from an organic acid, an organic acid salt, catechol, resorcinol, a phenol, maleic anhydride, phthalic anhydride, catechol, pyrogallol, gallic acid or esters thereof, benzotriazole, carboxybenzotriazole, fructose, ammonium thiosulfate, glycine, tetramethylguanidine, iminodiacetic acid, dimethylacetoacetamide, trihydroxybenzene, dihydroxybenzene, salicyclohydroxamic, thioglycerol, and mixtures thereof.

4. The composition of claim 1 further comprising hydroxylamine or an acid salt thereof.

5. The composition of claim 4 wherein said hydroxylamine comprises diethyl hydroxylamine.

6. The composition of claim 1 wherein water-miscible organic solvent comprises glycol ether, wherein the glycol ether is selected from the group consisting of ethylene glycol monomethyl ether, ethylene glycol monoethyl ether, ethylene glycol monobutyl ether, ethylene glycol dimethyl ether, ethylene glycol diethyl ether, diethylene glycol monomethyl ether, diethylene glycol monoethyl ether, diethylene glycol monopropyl ether, diethylene glycol monoisopropyl ether, diethylene glycol monobutyl ether, diethylene glycol monoisobutyl ether, diethylene glycol monobenzyl ether, diethylene glycol dimethyl ether, diethylene glycol diethyl ether, triethylene glycol monomethyl ether, triethylene glycol dimethyl ether, polyethylene glycol monomethyl ether, diethylene glycol methyl ethyl ether, triethylene glycol ethylene glycol monomethyl ether acetate, ethylene glycol monoethyl ether acetate, propylene glycol monomethyl ether, propylene glycol dimethyl ether, propylene glycol monobutyl ether, propylene glycol, monopropyl ether, dipropylene glycol monomethyl ether, dipropylene glycol monopropyl ether, dipropylene glycol monoisopropyl ether, dipropylene monobutyl ether, dipropylene glycol diisopropyl ether, tripropylene glycol monomethyl ether, 1-methoxy-2-butanol, 2-methoxy-1-butanol, 2-methoxy-2-methylbutanol, 1,1-dimethoxyethane, and 2-(2-butoxyethoxy) ethanol.

7. The composition of claim 1 further comprising a fluoride ion source.

8. The composition of claim 7 wherein the fluoride ion source comprises a compound having a general formula $R_5R_6R_7R_8NF$ where $R_5$, $R_6$, $R_7$, and $R_8$ are independently hydrogen, an alcohol group, an alkoxy group, an alkyl group and mixtures thereof.

9. The composition of claim 7 wherein the fluoride containing compound is selected from tetramethyl ammonium fluoride, tetraethyl ammonium fluoride, tetrabutyl ammonium fluoride, choline fluoride, and mixtures thereof.

10. The composition of claim 7 wherein the fluoride containing compound comprises fluoroboric acid.

11. The composition of claim 1 wherein the composition comprises a quaternary ammonium compound.

12. The composition of claim 11 wherein the quaternary ammonium compound is selected from the group consisting of tetramethylammonium hydroxide, tetraethylammonium hydroxide, tetrapropylammonium hydroxide, tetrabutylammonium hydroxide, trimethylethylammonium hydroxide, (2-hydroxyethyl)trimethylammonium hydroxide, (2-hydroxyethyl)triethylammonium hydroxide, (2-hydroxyethyl) tripropylammonium hydroxide, (1-hydroxypropyl)trimethylammonium hydroxide, and mixtures thereof.

13. The composition of claim 1 further comprising an amine.

14. The composition of claim 1 further comprising a sulfonic acid or a salt thereof.

15. A method for removing residues comprising BARC from a substrate comprising a dielectric material comprising:
    contacting the substrate with a composition that comprises: from about 0.01% to about 40% by weight of a salt selected from a guanidinium salt, an acetamidinium salt, a formamidinium salt, and mixtures thereof; water; and optionally a water-miscible organic solvent provided that the composition is free of an oxidizer and abrasive particles.

16. A composition for removing residues from a substrate, the composition consisting of:
    a salt selected from the group consisting of: guanidine hydrochloride, guanidine sulface, amino-guanidine hydrochloride, guanidine acetic acid, guanidine carbonate, guanidine nitrate, formanimide, formamidine-sulfinic acid, formamidine acetate, aminoguanidine carbonate, aminoguanidine carbonate hydrochloride, formamidine chloride, and mixtures thereof;
    water;

a water-miscible organic solvent selected from the group consisting of dimethylacetamide, N-methyl pyrrolidinone, dimethylsulfoxide, dimethylformamide, N-methylformamide, formamide, dimethyl-2-piperidone, tetrahydrofurfuryl alcohol, a glycol ether, glycerol, and mixtures thereof;

optionally a corrosion inhibitor;
optionally a hydroxylamine or an acid salt thereof;
optionally a fluoride ion source;
optionally a quaternary ammonium compound; and
optionally an amine,
provided that the composition is free of an oxidier and is free of abrasive particles.

17. The composition of claim 16 wherein the corrosion inhibitor is present and comprises at least one selected from an organic acid, an organic acid salt, catechol, resorcinol, a phenol, maleic anhydride, phthalic anhydride, catechol, pyrogallol, gallic acid or esters thereof, benzotriazole, carboxybenzotriaole, fructose, ammonium thiosulfate, glycine, tetramethylguanidine, iminodiacetic acid, dimethylacetoacetamide, trihydroxybenzene, dihydroxybenzene, salicyclohydroxamic, thioglycerol, and mixtures thereof.

18. The composition of claim 16 wherein said hydroxylamine is present and comprises diethyl hydroxylamine.

19. The composition of claim 16 wherein the fluoride ion source is present and comprises a compound having a general formula $R_5R_6R_7R_8NF$ where $R_5$, $R_6$, $R_7$, and $R_8$ are independently hydrogen, an alcohol group, an alkoxy group, an alkyl group and mixtures thereof.

20. The composition of claim 19 wherein the fluoride ion source is selected from tetramethyl ammonium fluoride, tetraethyl ammonium fluoride, tetrabutyl ammonium fluoride, choline fluoride, and mixtures thereof.

21. The composition of claim 20 wherein the fluoride containing compound comprises fluoroboric acid.

22. The composition of claim 16 wherein the quaternary ammonium compound is present and is selected from the group consisting of tetramethylammounium hydroxide, tetraethylammonium hydroxide, tetrapropylammonium hydroxide, tetrabutylammonium hydroxide, trimethylethylammonium hydroxide, (2-hydroxyethyl)trimethylammonium hydroxide, (2-hydroxyethyl)triethylammonium hydroxide, (2-hydroxyethyl)tripropylammonium hydroxide, (1-hydroxypropyl)trimethylammonium hydroxide, and mixtures thereof.

23. The composition of claim 16 wherein the amine is present.

* * * * *